(12) United States Patent
Xie et al.

(10) Patent No.: US 9,837,467 B2
(45) Date of Patent: Dec. 5, 2017

(54) LED VIRTUAL ARRANGEMENT AND LED DISPLAY SCREEN USING THE SAME

(71) Applicant: SHENZHEN AOTO ELECTRONICS CO., LTD., Shenzhen, Guangdong (CN)

(72) Inventors: Mingpu Xie, Shenzhen (CN); Xuanzhong Li, Shenzhen (CN); Shengcai Lu, Shenzhen (CN); Ling Liu, Shenzhen (CN); Zhenzhi Wu, Shenzhen (CN); Yi Shen, Shenzhen (CN); Hanqu Wu, Shenzhen (CN)

(73) Assignee: SHENZHEN AOTO ELECTRONICS CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/028,900

(22) PCT Filed: Jul. 18, 2014

(86) PCT No.: PCT/CN2014/082524
§ 371 (c)(1),
(2) Date: Apr. 12, 2016

(87) PCT Pub. No.: WO2016/008158
PCT Pub. Date: Jan. 21, 2016

(65) Prior Publication Data
US 2016/0254317 A1 Sep. 1, 2016

(51) Int. Cl.
*H01L 27/15* (2006.01)
*G09F 9/33* (2006.01)
(Continued)

(52) U.S. Cl.
CPC .............. *H01L 27/156* (2013.01); *G09F 9/33* (2013.01); *H01L 25/0753* (2013.01); *H01L 33/64* (2013.01)

(58) Field of Classification Search
CPC .................................................... H01L 27/156
See application file for complete search history.

(56) References Cited

FOREIGN PATENT DOCUMENTS

| CN | 1892745 | 1/2007 |
|---|---|---|
| CN | 101000125 | 7/2007 |

(Continued)

OTHER PUBLICATIONS

International Search Report of PCT/CN2014/082524, dated Apr. 22, 2015, 6 pages total.

*Primary Examiner* — Joseph L Williams
(74) *Attorney, Agent, or Firm* — Hamre, Schumann, Mueller & Larson, P.C.

(57) ABSTRACT

The invention is suitable for the LED virtual reality technology field, and provides an LED virtual arrangement and an LED display with the LED virtual arrangement, which aims to solve the problem existing in the prior art that the gap between the lamps in the unit area of the four lamps virtual arrangement is large, which results in poor heat dissipation effect. The LED virtual arrangement includes a first three-color LED unit and a second three-color LED unit; each of the first three-color LED unit and the second three-color LED units respectively comprises a red LED, a green LED and a blue LED, and the red LED, green LED and blue LED are respectively arranged at the three vertices of a right triangle. That the red LED, green LED and blue LED are arranged at the three vertices of the triangle, effectively reduce the number of LED lamps, increase the gap between the LEDs in the unit area, and is conducive to improving the heat dissipation effect.

10 Claims, 3 Drawing Sheets

(51) Int. Cl.
*H01L 25/075* (2006.01)
*H01L 33/64* (2010.01)

(56) References Cited

FOREIGN PATENT DOCUMENTS

| CN | 201435189 | 3/2010 |
| CN | 202049688 | 11/2011 |
| CN | 202307006 | 7/2012 |
| CN | 104112405 | 10/2014 |
| JP | 2006-292858 | 10/2006 |

LED VIRTUAL ARRANGEMENT AND LED DISPLAY SCREEN USING THE SAME

TECHNICAL FIELD

The present invention belongs to the LED virtual reality technology field, and in particular, relates to an LED virtual arrangement and an LED display screen with the LED virtual arrangement.

BACKGROUND

At present, the application of virtual pixels of the LED display screen is developed very fast, the LED virtual display technology is most widely applied in four lamps virtual display, which is formed by two red lights (represented by R), one blue light (represented by B) and one green light (represented by G), and the two red lights are located in two vertices of the square in a diagonal, as shown in FIG. 1. One pixel is split into four independent units, each unit reproduces corresponding colors of four adjacent pixels in time-sharing multiplexing manner, so as to achieve that the effective visual pixel density increase by 4 times at most.

As we all know, the biggest cost of the LED display screen is the lamp, how to save the cost of the lamp without losing the brightness, is one of the goals of the LED display technology.

In the traditional four lamps virtual display technology, one pixel is formed by virtualizing four adjacent monochromatic LED lamps (two red, one green, one blue), two red LED lamps are selected because of the brightness of the red LED being the bottleneck of all LEDs, therefore adding one more red light to one pixel is for improving the brightness of the red light to achieve the white balance of the display screen (the RGB luminance ratio for white balance is 3:6:1).

SUMMARY

The present invention aims at providing an LED virtual arrangement which is formed by arranging three three-color LEDs, to solve the problem existing in the prior art that the gap between the lamps in the unit area of the four lamps virtual arrangement is large, which results in poor heat dissipation effect and poorer administrative levels for the image display.

The present invention provides an LED virtual arrangement comprising: multiple sets of first three-color LED units arranged in rows and multiple sets of second three-color LED units arranged in rows and corresponding to the first three-color LED units, wherein the first three-color LED unit and the second three-color LED unit are alternatively arranged in the same column; wherein each of the first three-color LED units and the second three-color LED units respectively comprises a red LED, a green LED and a blue LED, and the red LED, the green LED and the blue LED are respectively arranged at different apex of a right triangle; the first three-color LED unit and the second three-color LED unit are arranged in a cycle of every three columns or five rows.

Further more, any of the red LED, the green LED and the blue LED, and the adjacent LEDs in different color form four virtual pixels.

Further more, each of the first three-color LED units is square shaped and is provide with a first clear area at one corner thereof, the first clear area and the red LED in the same first three-color LED unit are in the same row and the first clear area and the green LED in the same first three-color LED unit are in a diagonal; each of the second three-color LED units is square shaped and is provide with a second clear area at one corner thereof, the second clear area and the red LED in the same second three-color LED unit are in the same row and the second clear area and the blue LED in the same second three-color LED unit are in a diagonal.

Further more, the first clear area, the adjacent first clear area and the adjacent second clear area are arranged in an isosceles triangle.

Further more, two adjacent first clear areas and two adjacent second clear areas are arranged in a square.

Further more, any of the red LED, the green LED and the blue LED, and the adjacent LEDs in the same color are arranged in the right triangle, the other two LEDs and the adjacent LEDs in the same color are arranged in the square.

Further more, the red LED and the adjacent red LEDs are arranged in the right triangle, the blue LED and the adjacent blue LEDs are arranged in the square, and the green LED and the adjacent green LEDs are arranged in the square.

Further more, any of the red LED, the green LED and the blue LED, and the adjacent LEDs in the same color are arranged in the square, the other two LEDs and the adjacent LEDs in the same color are arranged in the right triangle.

Further more, the red LED and the adjacent red LEDs are arranged in the square, the blue LED and the adjacent blue LEDs are arranged in the right triangle, and the green LED and the adjacent green LEDs are arranged in the right triangle.

The present invention also provides an LED display screen, comprising the LED virtual arrangement mentioned above and a mask disposed on the LED virtual arrangement.

Compared with the prior art, the technology effect of this invention is that the red LED, the green LED and the blue LED are respectively arranged at different apex of a right triangle, that is, each of the first three-color LED units and the second three-color LED units respectively comprises three LEDs in different color, which can effectively reduce the number of LED lamps while ensuring the same number of virtual pixels, reduce the overall cost of LED display screen; and arranging one red LED, one green LED and one blue LED in each of the first three-color LED units and the second three-color LED units, effectively reduce the number of LED lamps, increase the gap between the LEDs in the unit area, and is conducive to improving the heat dissipation effect.

DESCRIPTION OF EMBODIMENTS

To make the objectives, technical solutions, and advantages of the present invention clearer and more comprehensible, the following further describes the present invention in detail with reference to the accompanying drawings and embodiments. It should be understood that the specific embodiment described herein is merely used to explain the present invention but is not used to limit the present invention to it.

Referring to FIG. 2 to FIG. 5, the embodiments of the present invention provides LED virtual arrangement comprising: multiple sets of first three-color LED units 10 arranged in rows and multiple sets of second three-color LED units 20 arranged in rows and corresponding to the first three-color LED units 10, wherein the first three-color LED unit 10 and the second three-color LED unit 20 are alternatively arranged in the same column; wherein each of the first three-color LED units 10 and the second three-color LED units 20 respectively comprises a red LED 1 (represented by R), a green LED 2 (represented by G) and a blue LED 3 (represented by B), and the red LED 1, the green LED 2 and the blue LED 3 are respectively arranged at different apex of a right triangle; the first three-color LED unit 10 and the second three-color LED unit 20 are arranged in a cycle of every three columns or five rows.

Referring to FIG. 2 to FIG. 5, in the embodiments of the present invention, the LED virtual arrangement takes the advantage that the red LED 1, the green LED 2 and the blue LED 3 are respectively arranged at different apex of a right triangle, that is each of the first three-color LED units 10 and the second three-color LED units 20 respectively comprises three LEDs in different color, which can effectively reduce the number of LED lamps while ensuring the same number of virtual pixels, reduce the overall cost of LED display screen; and arranging one red LED 1, one green LED 2 and one blue LED 3 in each of the first three-color LED units 10 and the second three-color LED units 20, may effectively reduce the number of LED lamps, increase the gap between the LEDs in the unit area, and is conducive to improving the heat dissipation effect.

Figure 3:
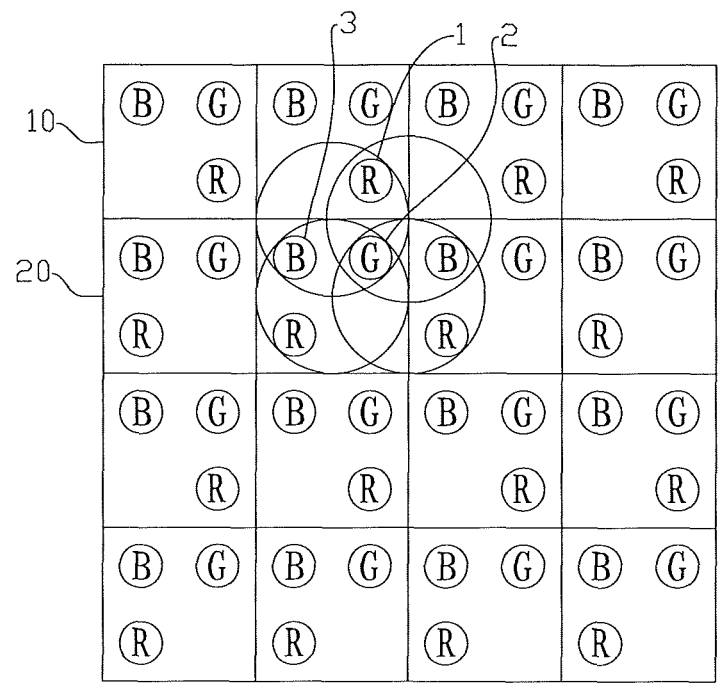
FIG. 3 is a schematic view of the pixels formed by the LED virtual arrangement in FIG. 2.
Figure 5:
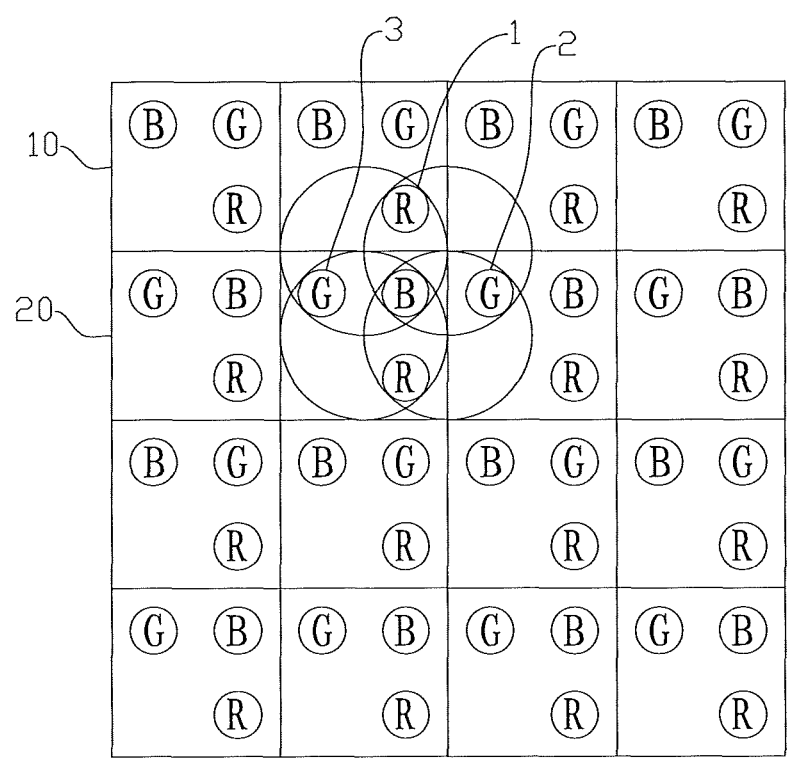
FIG. 5 is a schematic view of the pixels formed by the LED virtual arrangement in FIG. 4.

Referring to FIG. 3 and FIG. 5, any of the red LED 1, the green LED 2 and the blue LED 3, and the adjacent LEDs in different color form four virtual pixels. It can be understood that: in two adjacent first three-color LED units 10 and two adjacent second three-color LED units 20, the red LED 1 and two adjacent LEDs in different color may form one virtual pixel, and other three virtual pixels may be formed in the similar manner and the red LED 1 is the common point of the four pixels; the green LED 2 and two adjacent LEDs in different color may form one virtual pixel, and other three virtual pixels may be formed in the similar manner and the green LED 2 is the common point of the four pixels; the blue LED 3 and two adjacent LEDs in different color may form one virtual pixel, and other three virtual pixel may be formed in the similar manner and the blue LED 3 is the common point of the four pixels. The LED virtual arrangement is formed by arranging the monochromatic LEDs in each first three-color LED unit 10 and second three-color LED unit 20, each first three-color LED unit 10 and second three-color LED unit 20 reduce one red LED 1 while ensuring the same number of virtual pixels compared with the four lamps virtual arrangement, such that the overall cost of LED display screen is reduced.

Figure 1:
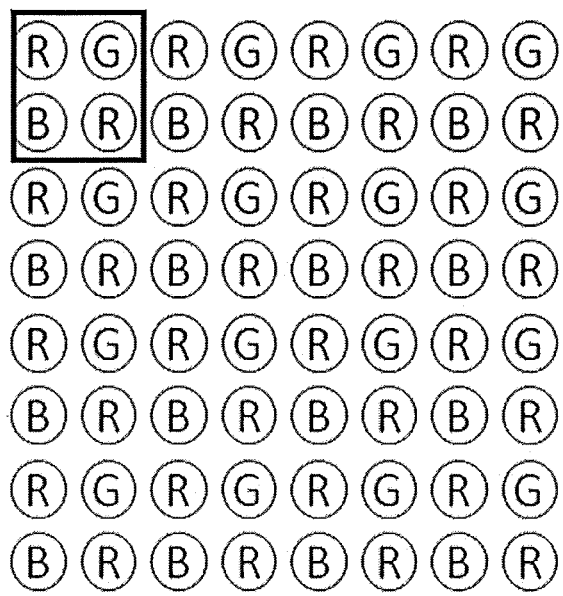
FIG. 1 is the virtual display arrangement of four lamps in the prior art.
Figure 2:
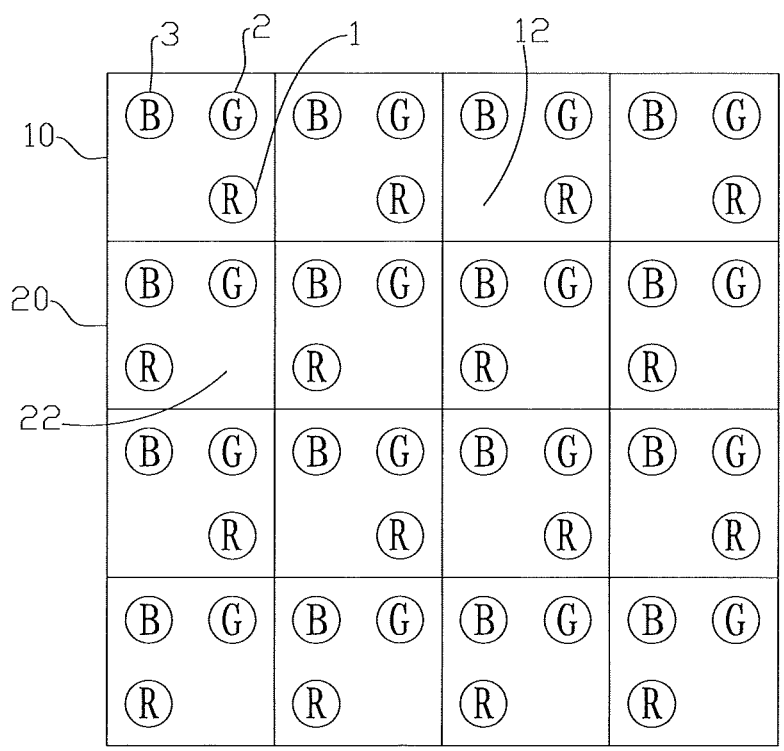
FIG. 2 is the first arrangement of the LED virtual arrangement provided by the embodiment of the invention.
Figure 4:
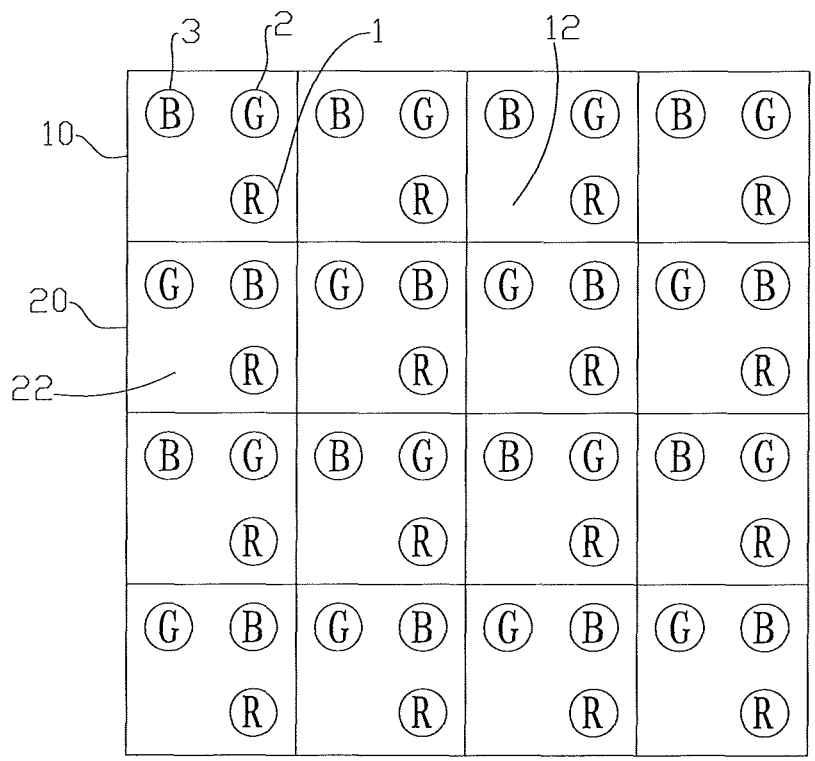
FIG. 4 is the second arrangement of the LED virtual arrangement provided by the embodiment of the invention.

Referring to FIG. 2 and FIG. 4, each of the first three-color LED units is square shaped and is provide with a first clear area 12 at one corner thereof, the first clear area 12 and the red LED 1 in the same first three-color LED unit 10 are in the same row and the first clear area 12 and the green LED 2 in the same first three-color LED unit 10 are in a diagonal; each of the second three-color LED units 20 is square shaped and is provide with a second clear area 22 at one corner thereof, the second clear area 22 and the red LED 1 in the same second three-color LED unit 20 are in the same row and the second clear area 22 and the blue LED 3 in the same second three-color LED unit 20 are in a diagonal. It can be understood that: in the same column, in the adjacent first three-color LED unit 10 and second three-color LED unit 20, the first clear area 12 and the second clear area 22 are arranged at opposite corners, and the red LED in the first three-color LED unit 10 and the red LED in the second three-color LED unit 20 are arranged at opposite corners, the blue LEDs 3 are arranged in one line and the green LEDs are arranged in one line. The first clear area 12 and the second clear area 22 are set to reduce the number of the monochrome LEDs, but the total virtual pixels doesn't change by using the arrangement mentioned above. By setting the first clear area 12 and the second clear area 22 in the first three-color LED unit 10 and the second three-color LED unit 20, the required drive current is reduced by about ¼ compared with the four lamps virtual arrangement, such that the power consumption of the whole LED display screen is greatly reduced.

Referring to FIG. 2, the first clear area 12, the adjacent first clear area 12 and the adjacent second clear area 22 are arranged in an isosceles triangle. It can be understood that: for the first three-color LED units 10 in the same row, one red LED 1 is disposed between two adjacent first clear areas 12; for the second three-color LED units 20 in the same row, one second clear areas 22 is disposed between two adjacent red LEDs 1; in the same column, the first clear area 12 and the second clear area 22 are diagonally disposed at two opposite corners of a rectangle, two red LEDs 1 are respectively disposed at the other two corners of the rectangle.

Referring to FIG. 4, two adjacent first clear areas 12 and two adjacent second clear areas 22 are arranged in a square. It can be understood that: for the first three-color LED units 10 in the same row, one red LED 1 is disposed between two adjacent first clear areas 12; for the second three-color LED units 20 in the same row, one second clear areas 22 is disposed between two adjacent red LEDs 1; in the same column, the first clear areas 12 and second clear areas 22 are arranged in one line, and the red LEDs are arranged in one line.

Referring to FIG. 2 and FIG. 3, any of the red LED 1, the green LED 2 and the blue LED 3, and the adjacent LEDs in the same color are arranged in the right triangle, the other two LEDs and the adjacent LEDs in the same color are arranged in the square. It can be understood that: such arrangement make every monochromatic LEDs can form virtual four pixels by combining the adjacent LEDs in different colors together. Because of the first clear areas 12 and second clear areas 22, the gaps between monochromatic LEDs in the first three-color LED units 10 and second three-color LED units 20, which is conducive to heat dissipation, and in addition increases the black area on the mask of the LED display screen, in this way, the resulted background depth is relatively high, which makes the LED display screen display more vivid and a sense of hierarchy. The black area described here corresponds to the locations of the first clear areas 12 and second clear areas 22.

Referring to FIG. 2 and FIG. 3, the red LED 1 and the adjacent red LEDs are arranged in the right triangle, the blue LED 3 and the adjacent blue LEDs 3 are arranged in the square, and the green LED 2 and the adjacent green LEDs 2 are arranged in the square. It can be understood that: the adjacent first three-color LED unit 10 and the second three-color LED unit 20, the red LEDs are arranged in the right triangle, the blue LEDs 3 are arranged in the square and the green LEDs 2 are arranged in the square. The square formed by the blue LEDs 3 and the square formed by the green LEDs 2 are partially overlapped. In the square formed by the blue LEDs 3, a connecting line between the red LEDs 1 on the edges of the square and the connecting line between the green LEDs 2 on the other edges of the square are the centerlines of the square perpendicular with each other. Similarly, in the square formed by the green LEDs 2, the connecting line between the red LEDs 1 on the edges of the square and the connecting line between the blue LEDs 3 on the other edges of the square are the centerlines of the square perpendicular with each other.

Referring to FIG. 4 and FIG. 5, further more, any of the red LED 1, the green LED 2 and the blue LED 3, and the adjacent LEDs in the same color are arranged in the square, the other two LEDs and the adjacent LEDs in the same color are arranged in the right triangle. It can be understood that: such arrangement make every monochromatic LEDs can form virtual four pixels by combining the adjacent LEDs in different colors together. Because of the first clear areas 12 and second clear areas 22, the gaps between monochromatic LEDs in the first three-color LED units 10 and second three-color LED units 20 become larger, which is conducive to heat dissipation, and in addition increases the black area on the mask of the LED display screen, in this way, the resulted background depth is relatively high, which makes the LED display screen display more vivid and a sense of hierarchy. The black area described here corresponds to the locations of the first clear areas 12 and second clear areas 22.

Referring to FIG. 4 and FIG. 5, the red LED 1 and the adjacent red LEDs are arranged in the square, the blue LED 3 and the adjacent blue LEDs 3 are arranged in the right triangle, and the green LED 2 and the adjacent green LEDs 2 are arranged in the right triangle. It can be understood that: the adjacent first three-color LED unit 10 and the second three-color LED unit 20, the red LEDs are arranged in the square, the blue LEDs 3 are arranged in the right triangle and the green LEDs 2 are arranged in the right triangle. The right triangle formed by the blue LEDs 3 and the right triangle formed by the green LEDs 2 are partially overlapped and form one square, whose center is provided with one red LED 1.

The embodiment of the preset invention also provides an LED display screen, comprising the LED virtual arrangement mentioned above and a mask disposed on the LED virtual arrangement. In this embodiment, the LED virtual arrangement herein and the LED virtual arrangement in the above embodiment have the same structure and function identically, and they won't be repeated here.

The foregoing descriptions are merely exemplary embodiment of the present invention, but are not intended to limit the present invention to it. Any modification, equivalent replacement, or improvement made without departing from the spirit and principle of the present invention shall fall within the protection scope of the present invention.

What is claimed is:

1. An LED virtual arrangement, comprising:
    multiple sets of first three-color LED units arranged in rows and multiple sets of second three-color LED units arranged in rows and corresponding to the first three-color LED units,
    wherein the first three-color LED unit and the second three-color LED unit are alternatively arranged in the same column;
    wherein each of the first three-color LED units and the second three-color LED units respectively comprises a red LED, a green LED, and a blue LED, and the red LED, the green LED, and the blue LED are respectively arranged at a different apex of a right triangle;
    the first three-color LED unit and the second three-color LED unit are arranged in a cycle of every three columns or five rows.

2. The LED virtual arrangement of claim 1, wherein any of the red LED, the green LED, and the blue LED, and the adjacent LEDs in different color form four virtual pixels.

3. The LED virtual arrangement of claim 2, wherein each of the first three-color LED units is square shaped and is provide with a first clear area at one corner thereof, the first clear area and the red LED in the same first three-color LED unit are in the same row and the first clear area and the green LED in the same first three-color LED unit are in a diagonal;
    each of the second three-color LED units is square shaped and is provided with a second clear area at one corner thereof, the second clear area and the red LED in the same second three-color LED unit are in the same row and the second clear area and the blue LED in the same second three-color LED unit are in a diagonal.

4. The LED virtual arrangement of claim 3, wherein the first clear area, the adjacent first clear area, and the adjacent second clear area are arranged in an isosceles triangle.

5. The LED virtual arrangement of claim 3, wherein two adjacent first clear areas and two adjacent second clear areas are arranged in a square.

6. The LED virtual arrangement of claim 1, wherein any of the red LED, the green LED, and the blue LED, and the adjacent LEDs in the same color are arranged in the right triangle, the other two LEDs and the adjacent LEDs in the same color are arranged in the square.

7. The LED virtual arrangement of claim 6, wherein the red LED and the adjacent red LEDs are arranged in the right triangle, the blue LED and the adjacent blue LEDs are arranged in the square, and the green LED and the adjacent green LEDs are arranged in the square.

8. The LED virtual arrangement of claim 1, wherein any of the red LED, the green LED, and the blue LED, and the adjacent LEDs in the same color are arranged in the square, the other two LEDs and the adjacent LEDs in the same color are arranged in the right triangle.

9. The LED virtual arrangement of claim 8, wherein the red LED and the adjacent red LEDs are arranged in the square, the blue LED and the adjacent blue LEDs are arranged in the right triangle, and the green LED and the adjacent green LEDs are arranged in the right triangle.

10. An LED display screen, comprising the LED virtual arrangement of claim 1 and a mask disposed on the LED virtual arrangement.

* * * * *